United States Patent
Lu et al.

(10) Patent No.: US 10,601,180 B2
(45) Date of Patent: Mar. 24, 2020

(54) LOCK MECHANISM

(71) Applicant: FANUC CORPORATION, Yamanashi (JP)

(72) Inventors: Guoqiang Lu, Yamanashi-ken (JP); Yoshiyuki Kubo, Yamanashi-ken (JP)

(73) Assignee: FANUC CORPORATION, Yamanashi (JP)

( * ) Notice: Subject to any disclaimer, the term of this patent is extended or adjusted under 35 U.S.C. 154(b) by 0 days.

(21) Appl. No.: 16/193,204

(22) Filed: Nov. 16, 2018

(65) Prior Publication Data

US 2019/0157805 A1    May 23, 2019

(30) Foreign Application Priority Data

Nov. 21, 2017 (JP) .................... 2017-223551

(51) Int. Cl.
 *H01R 12/00* (2006.01)
 *H01R 13/639* (2006.01)
 (Continued)

(52) U.S. Cl.
 CPC ..... *H01R 13/639* (2013.01); *G02F 1/133308* (2013.01); *H01R 12/737* (2013.01);
 (Continued)

(58) Field of Classification Search
 CPC .. H01R 12/737; H01R 12/722; H01R 13/639; H05K 7/1452; H05K 1/181;
 (Continued)

(56) References Cited

U.S. PATENT DOCUMENTS 4,179,724 A * 12/1979 Bonhomme ......... H05K 7/1424
  361/727
4,321,654 A *  3/1982 Nakajo ............... H05K 7/1449
  108/64

(Continued)

FOREIGN PATENT DOCUMENTS

JP      5849494 U    4/1983
JP      135518 Y2   10/1989

(Continued)

OTHER PUBLICATIONS

English Machine Translation for Japanese Publication No. 01-035518 Y2, published Oct. 30, 1989, 3 pgs.

(Continued)

*Primary Examiner* — Abdullah A Riyami
*Assistant Examiner* — Vladimir Imas
(74) *Attorney, Agent, or Firm* — Fredrikson & Byron, P.A.

(57) ABSTRACT

A lock mechanism is provided for locking inside a casing a plurality of printed circuit boards which are connected through connectors to a backplane inside the casing. The lock mechanism has an engaging member provided with a plurality of engaging pieces respectively engageable with engaged portions formed respectively in the plurality of printed circuit boards. When the engaging pieces are respectively engaged with the engaged portions, the printed circuit boards are pressed in a direction to fit the connectors of the printed circuit boards with the connectors of the backplane.

7 Claims, 6 Drawing Sheets

(51) Int. Cl.
*G02F 1/1333* (2006.01)
*H05K 7/14* (2006.01)
*H01R 12/73* (2011.01)
*H01R 12/72* (2011.01)
*H05K 1/18* (2006.01)

(52) U.S. Cl.
CPC ......... *H05K 7/1409* (2013.01); *H05K 7/1452* (2013.01); *G02F 2001/133314* (2013.01); *H01R 12/722* (2013.01); *H05K 1/181* (2013.01); *H05K 2201/09063* (2013.01); *H05K 2201/10189* (2013.01)

(58) Field of Classification Search
CPC .......... H05K 2201/09063; H05K 2201/10189; G02F 1/133308; G02F 2001/133314
USPC .......................................................... 439/65
See application file for complete search history.

(56) References Cited

U.S. PATENT DOCUMENTS

| | | | | |
|---|---|---|---|---|
| 4,447,948 A * | 5/1984 | Golinski | ............. | H01R 13/645 227/111 |
| 4,523,254 A * | 6/1985 | Konshak | ................. | H05K 7/16 361/727 |
| 4,533,976 A * | 8/1985 | Suwa | ...................... | G11C 5/00 361/679.02 |
| 4,556,268 A * | 12/1985 | Noschese | ............... | H01R 12/82 439/260 |
| 4,609,970 A * | 9/1986 | Hilpert | ................. | H05K 9/0039 361/757 |
| 4,628,146 A * | 12/1986 | Schmotz | ............... | H01L 23/315 174/521 |
| 4,790,762 A * | 12/1988 | Harms | ................. | H05K 7/1478 439/59 |
| 4,869,673 A * | 9/1989 | Kreinberg | .......... | H01R 12/7088 439/64 |
| 4,899,259 A * | 2/1990 | Voeten | ................... | H01G 2/065 361/539 |
| 4,931,679 A * | 6/1990 | Fournier | ............... | H01F 27/027 29/839 |
| 4,945,633 A * | 8/1990 | Hakanen | ............. | H05K 9/0039 174/387 |
| 5,011,433 A * | 4/1991 | Pfeiffer | ................. | H01R 12/58 439/279 |
| 5,297,009 A * | 3/1994 | Gelez | ................... | H05K 7/1411 211/41.17 |
| 5,297,116 A * | 3/1994 | Ikuma | ................... | G11B 33/142 369/13.34 |
| 5,377,080 A * | 12/1994 | Lin | ...................... | H05K 5/0008 206/707 |
| 5,953,215 A * | 9/1999 | Karabatsos | ............ | H05K 1/029 361/736 |
| 6,128,810 A * | 10/2000 | Suzuki | ................... | H01R 43/20 29/33 M |
| 6,288,902 B1 * | 9/2001 | Kim | ....................... | G11B 33/08 206/701 |
| 6,663,401 B2 * | 12/2003 | Billman | ............... | H01R 13/514 439/701 |
| 6,666,692 B2 * | 12/2003 | Billman | ............... | H01R 13/514 439/76.1 |
| 7,057,904 B2 * | 6/2006 | Bundza | ................. | H04Q 1/02 361/727 |
| 7,079,381 B2 * | 7/2006 | Brehm | ................. | H05K 7/1454 361/679.33 |
| 7,266,634 B2 * | 9/2007 | Ware | ................... | G06F 13/1684 711/105 |
| 7,363,422 B2 * | 4/2008 | Perego | ................ | G06F 13/1684 711/105 |
| 7,442,094 B2 * | 10/2008 | Denter | ................... | H04Q 1/142 361/769 |
| 7,677,900 B2 * | 3/2010 | Crighton | ............ | H01R 12/7064 439/62 |
| 7,819,697 B2 * | 10/2010 | Glover | ................. | H01R 13/514 439/607.07 |
| 8,167,651 B2 * | 5/2012 | Glover | ............... | H01R 13/6587 439/607.08 |
| 9,362,641 B2 * | 6/2016 | Bachmutsky | ........ | H01R 12/737 |
| 10,204,659 B1 * | 2/2019 | Keehn | ................. | G11B 33/122 |
| 2005/0243533 A1 | 11/2005 | Malone et al. | | |

FOREIGN PATENT DOCUMENTS

| | | |
|---|---|---|
| JP | 5145251 A | 6/1993 |
| JP | 562082 U | 8/1993 |
| JP | 1065368 A | 3/1998 |
| JP | 2003142853 A | 5/2003 |

OTHER PUBLICATIONS

English Machine Translation for Japanese Publication No. 05-062082 U, published Aug. 13, 1993, 6 pgs.
English Abstract and Machine Translation for Japanese Publication No. 05-145251 A, published Jun. 11, 1993, 6 pgs.
English Abstract and Machine Translation for Japanese Publication No. 10-065368 A, published Mar. 6, 1998, 6 pgs.
English Abstract and Machine Translation for Japanese Publication No. 2003-142853 A, published May 16, 2003, 11 pgs.
English Machine Translation of Japanese Publication No. S58-049494 U, published Apr. 4, 1983, 3 pgs.

* cited by examiner

LOCK MECHANISM

CROSS-REFERENCE TO RELATED APPLICATION

This application is based upon and claims the benefit of priority from Japanese Patent Application No. 2017-223551 filed on Nov. 21, 2017, the contents of which are incorporated herein by reference.

BACKGROUND OF THE INVENTION

Field of the Invention

The present invention relates to a lock mechanism for locking, within a casing, a plurality of printed circuit boards which are connected through connectors to a backplane provided inside the casing.

Description of the Related Art

Japanese Utility Model Publication No. 01-035518 discloses a lock mechanism for preventing a plurality of printed circuit boards from coming off a casing mounting the printed circuit boards.

SUMMARY OF THE INVENTION

In the technology of Japanese Utility Model Publication No. 01-035518, it is unable to hold the printed circuit boards against the movement inside the casing, and thus, an anxiety arises in that connections become unstable between the printed circuit boards and those members connected to the printed circuit boards through connectors.

The present invention has been made in order to solve the aforementioned problem, and it is an object of the present invention to provide a lock mechanism capable of stably connecting printed circuit boards to a backplane inside a casing through connectors.

In one aspect, the present invention provides a lock mechanism for locking inside a casing a plurality of printed circuit boards which are connected through connectors to a backplane inside the casing. The mechanism has an engaging member provided with a plurality of engaging pieces respectively engageable with engaged portions which are respectively formed in the plurality of printed circuit boards, and the engaging pieces are configured to press the printed circuit boards in a direction to fit the connectors of the printed circuit boards with the connectors of the backplane when the engaging pieces are respectively engaged with the engaged portions.

According to the present invention, it is possible to stably connect the printed circuit boards to the backplane through the connectors within the casing.

The above and other objects, features, and advantages of the present invention will become more apparent from the following description when taken in conjunction with the accompanying drawings in which preferred embodiments of the present invention are shown by way of illustrative examples.

DESCRIPTION OF THE PREFERRED EMBODIMENTS

First Embodiment

[Overview of Lock Mechanism]

Figure 1A:
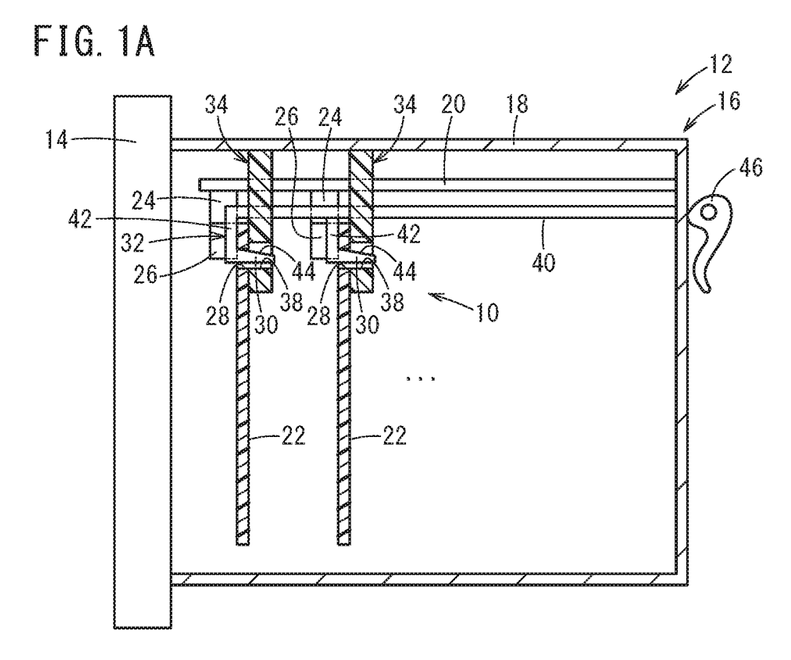
FIG. 1A is a schematic view showing a state inside a casing in which printed circuit boards are locked by a lock mechanism.
Figure 1B:
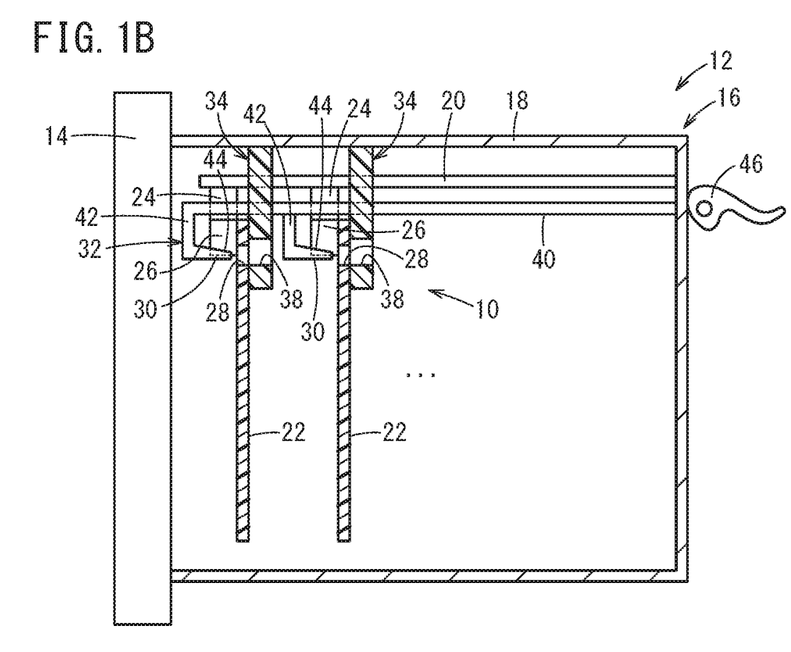
FIG. 1B is a schematic view showing a state inside the casing in which the printed circuit boards are released from being locked by the lock mechanism.

A lock mechanism 10 according to the present embodiment locks a plurality of printed circuit boards 22 connected to a backplane 20 inside a casing 18 of a control unit 16 which is attached to the back of a liquid crystal panel 14 of a numerical control device 12.

FIG. 1A is a schematic view showing a state inside the casing 18 in which the printed circuit boards 22 are locked by the lock mechanism 10. FIG. 1B is a schematic view showing another state inside the casing 18 in which the printed circuit boards 22 are released from being locked by the lock mechanism 10.

Each printed circuit board 22 has a connector 26 fitted with a connector 24 of the backplane 20. The connector 26 of each printed circuit board 22 is connected by an operator or the like to the connector 24 of the backplane 20. When the printed circuit boards 22 are locked by the lock mechanism 10, the lock mechanism 10 also presses the printed circuit board 22 so as to fit the connector 26 of the printed circuit board 22 with the connector 24 of the backplane 20.

[Configuration of Lock Mechanism]

Figure 2:
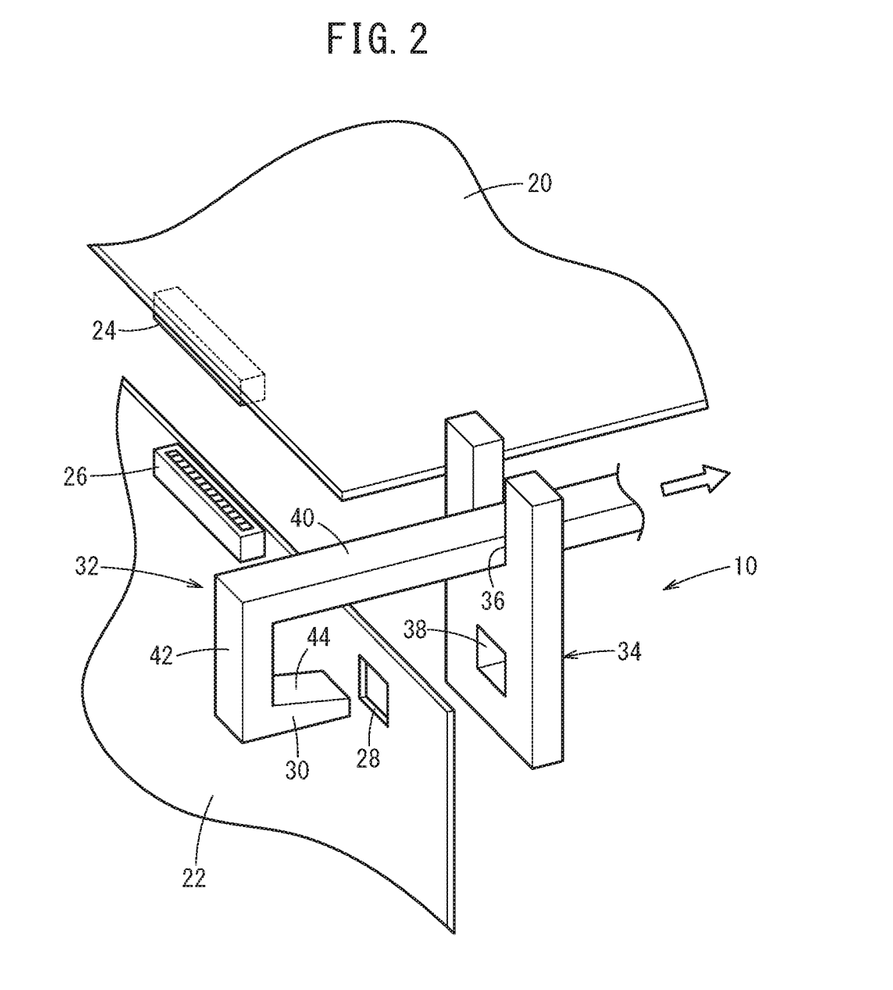
FIG. 2 is an exploded perspective view schematically shows the lock mechanism.

FIG. 2 is an exploded perspective view schematically showing the lock mechanism 10. The lock mechanism 10 is provided with an engaged portion 28 formed as a hole extending through each printed circuit board 22 in the thickness direction, an engaging member 32 having an engaging piece 30, and a fixing member 34 supporting the engaging member 32.

The engaged portion 28 is formed near a position where the connector 26 is provided on each printed circuit board 22. The fixing member 34 is fixed to the casing 18. The fixing member 34 has a support portion 36 slidably supporting the engaging member 32 and an insertion hole 38 into which the engaging piece 30 is inserted.

The engaging member 32 has a prismatic shaft portion 40, an extension 42 extending from the shaft portion 40 in a direction substantially perpendicular to the axial direction of the shaft portion 40, and the engaging piece 30 extending from the extension 42 in a direction substantially perpendicular to the axial direction of the extension 42. The extension 42 and an associated engaging piece 30 are formed to extend from the shaft portion 40 substantially in an L-shape when the engaging member 32 is viewed from the lateral side with the shaft portion 40 located over the engaging piece 30. Further, a surface of the engaging piece 30 facing the shaft portion 40 has a slant portion 44 which inclines downward from the extension 42 toward a distal end, when the engaging member 32 is viewed from the lateral side with the shaft portion 40 located over the engaging piece 30. As shown in FIGS. 1A and 1B, the engaging member 32 has a plurality of engaging pieces 30. The engaging member 32 has the engaging pieces 30 which are at least the same in number as the printed circuit boards 22. The engaging pieces 30 may be provided at regular intervals in the axial direction of the shaft portion 40 or may be provided at irregular intervals.

When the printed circuit boards 22 are to be locked by the lock mechanism 10, the engaging member 32 is moved in the arrowed direction in FIG. 2, whereby the engaging pieces 30 extends through the engaged portions 28 of the printed circuit boards 22 and are inserted into the insertion holes 38 of the fixing members 34, respectively. Thus, the engaging pieces 30 are engaged with the respective engaged portions 28, whereby the printed circuit boards 22 are pressed toward the backplane 20 due to the inclination of the slant portions 44 of the engaging pieces 30. Further, each printed circuit board 22 is sandwiched between the extension 42 and the associated fixing member 34.

Figure 3:
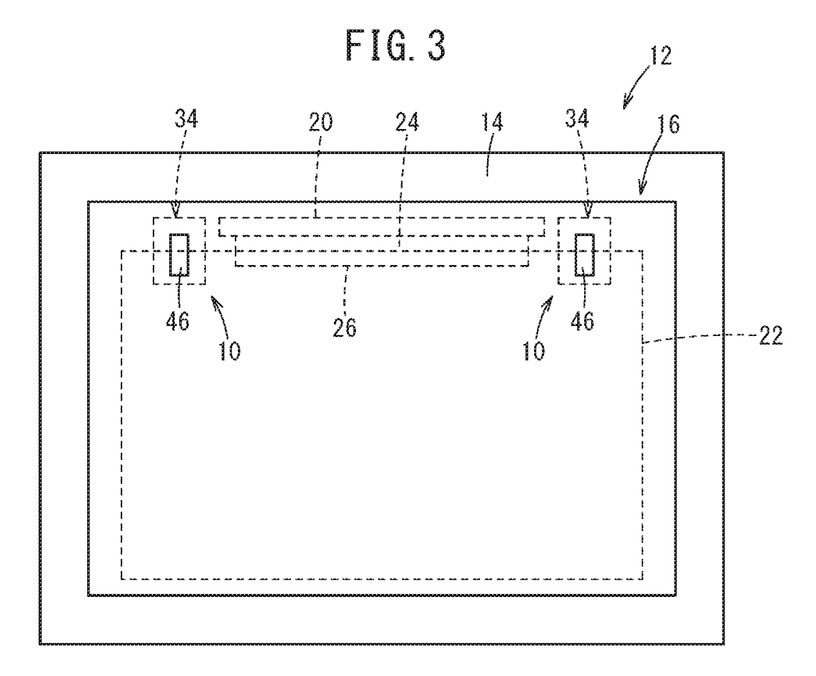
FIG. 3 is a schematic view of a liquid crystal panel and a control unit as viewed from back.

FIG. 3 is a schematic view of the liquid crystal panel 14 and the control unit 16 as viewed from the rear side. In the view of the liquid crystal panel 14 and the control unit from the rear side, the lock mechanisms 10 are arranged at two locations with the connector 24 of the backplane 20 and the connector 26 of the printed circuit board 22 interposed therebetween. Further, as shown in FIGS. 1A and 1B, the engaging member 32 is arranged between the respective printed circuit boards 22 and the backplane 20.

As shown in FIGS. 1A and 1B, operating portions 46 configured as levers are provided outside the casing 18. By operating the operating portions 46, the operator is able to move the engaging members 32 in the axial direction of the shaft portions 40, whereby it becomes possible to engage or disengage the engaging pieces 30 of the engaging member 32 with the engaged portions 28 of the printed circuit boards 22.

[Operation and Effect]

In the numerical control device 12, the plurality of printed circuit boards 22 are connected at their connectors 26 to the connectors 24 of the backplane 20 inside the casing 18. Because the numerical control device 12 is installed near a machine tool or the like in many situations, vibrations form the machine tool or the like is likely to be transmitted to the numerical control device 12 and operators and equipment may hit the numerical control device 12 by accident. This may cause the connectors 26 of the printed circuit boards 22 to come off the associated connectors 24 of the backplane 20 or may cause contact failure due to imperfect fittings between the connectors 26 and the connectors 24. Further, when vibrations or the like are transmitted to the numerical control device 12 while the connectors 26 and the connectors 24 are fitted imperfectly, the connectors 26 may be displaced relative to the connectors 24 to peel off coatings on pins of the connectors 24 or the connectors 26, thereby resulting in corrosion of the pins.

In order to avoid these drawbacks, in the present embodiment, when the printed circuit boards 22 are locked by the lock mechanism 10, the engaging pieces 30 of the engaging member 32 are respectively brought into engagement with the engaged portions 28 of the printed circuit boards 22, so that the printed circuit boards 22 are pressed toward the direction to fit the connectors 26 of the printed circuit boards 22 with the connectors 24 of the backplane 20. This makes it possible to firmly fit the connectors 26 of the printed circuit boards 22 with the connectors 24 of the backplane 20. Further in the state that the printed circuit boards 22 are locked by the lock mechanism 10, the engaging pieces 30 hold the printed circuit boards 22 against displacement toward the direction to disengage the connectors 26 of the printed circuit boards 22 from the connectors 24 of the backplane 20. Accordingly, it is possible to prevent the connectors 26 of the printed circuit boards 22 from coming off the connectors 24 of the backplane 20. Further, it is possible to prevent the relative displacement between the connectors 26 and the connectors 24 so as to avoid corrosion of the pins of the connectors 24 or the connectors 26.

Further, in the present embodiment, each printed circuit board 22 is formed with the engaged portion 28 near the connector 26. Because the application point of a force inputted from the engaging piece 30 of the engaging member 32 is located near the connector 26 of each printed circuit board 22, it is possible to firmly fit the connector 26 of each printed circuit board 22 with the associated connector 24 of the backplane 20.

Further, in the present embodiment, the engaging member 32 is arranged between the printed circuit boards 22 and the backplane 20. Because the printed circuit boards 22 and the backplane 20 are connected by the connectors 26 and the connectors 24, there is a gap between the printed circuit boards 22 and the backplane 20. Because the engaging member 32 is arranged in this gap, it is possible to suppress the dimension of the control unit 16 from being increased.

Further, in the present embodiment, the operating portions 46 operable by the operator to move the engaging member 32 are provided for engagement and disengagement between the engaging pieces 30 and the engaged portions 28 of the printed circuit boards 22. Accordingly, it is possible for the operator to easily lock and release the lock mechanism 10.

Further, in the present embodiment, the engaged portions 28 are each formed as a hole extending through each printed circuit board 22 in the thickness direction, and the engaging member 32 is configured to move in the thickness direction of the printed circuit boards 22 so that the engaging pieces 30 and the engaged portions 28 are engaged and released. Each engaging piece 30 is configured to be provided with the slant portion 44 on its surface into abutment against the printed circuit board 22. With this configuration, when the engaging member 32 is moved in the thickness direction of the printed circuit boards 22, it becomes possible to bring the engaging pieces 30 into engagements with the associated engaged portions 28, while pressing, using the slant portion 44, each printed circuit board 22 toward the direction to fit the connector 26 of the printed circuit board 22 with the associated connector 24 of the backplane 20.

Second Embodiment

In the first embodiment, the engaging member 32 is configured to move in the axial direction of the shaft portion 40 by bringing the respective engaging pieces 30 into engagements with the engaged portions 28 of the printed circuit boards 22. In the second embodiment, the engaging member 32 is configured to rotate about the axis of a shaft portion 40 by bringing respective engaging pieces 30 into engagements with engaged portions 28 of the printed circuit boards 22.

Figure 4A:
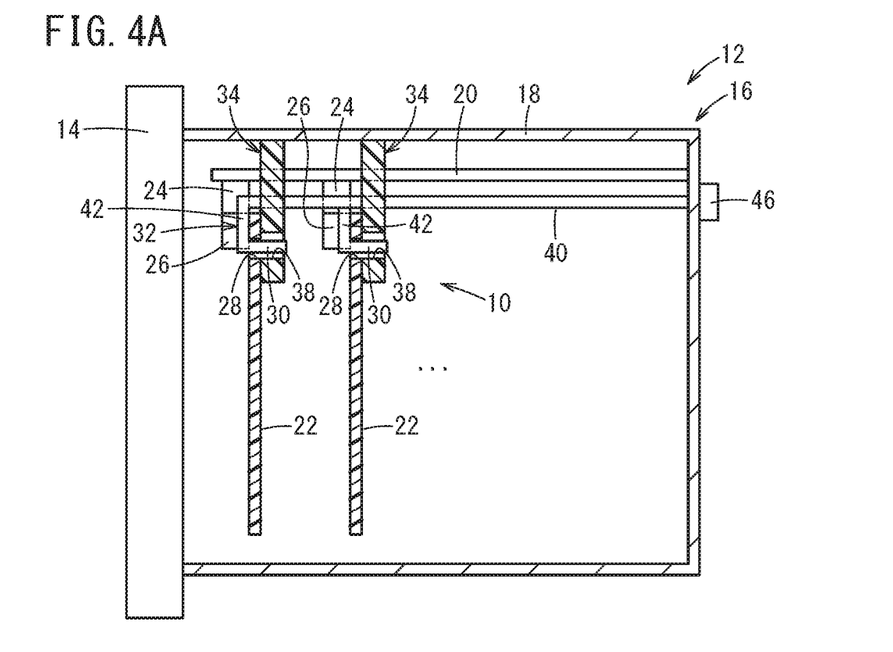
FIG. 4A is a schematic view showing a state inside a casing in which printed circuit boards are locked by a lock mechanism.
Figure 4B:
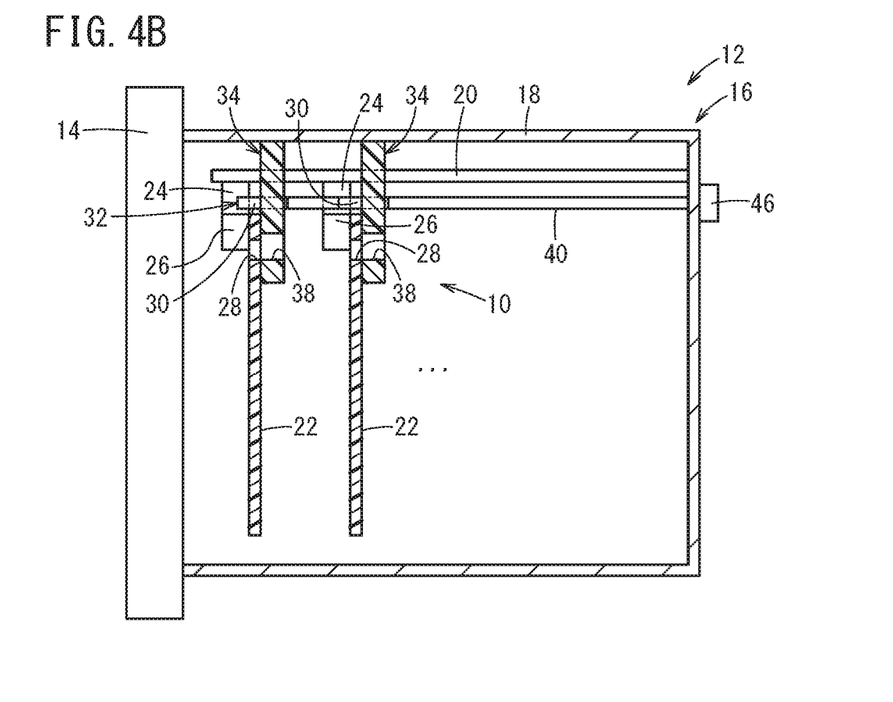
FIG. 4B is a schematic view showing a state inside the casing in which the printed circuit boards are released from being locked by the lock mechanism.
Figure 5:
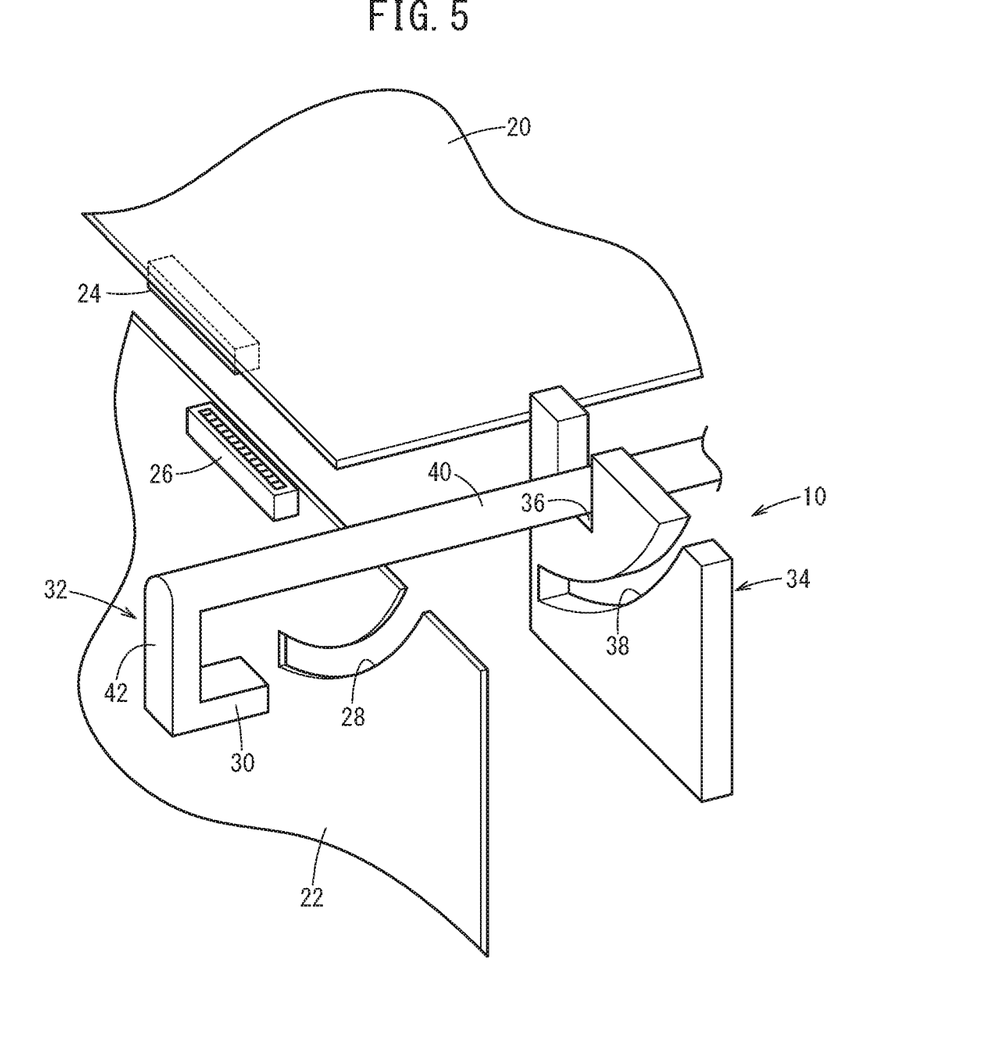
FIG. 5 is an exploded perspective view schematically showing the lock mechanism.

FIG. 4A is a schematic view showing a state inside a casing 18 in which the printed circuit boards 22 are locked by a lock mechanism 10. FIG. 4B is a schematic view showing another state inside the casing 18 in which the printed circuit boards 22 are released from being locked by the lock mechanism 10. FIG. 5 is an exploded perspective view schematically showing the lock mechanism 10.

The lock mechanism 10 is provided with the engaged portions 28, the engaging member 32 having the engaging pieces 30, and the fixing members 34 supporting the engaging member 32. Each of the engaged portions 28 is formed in the printed circuit board 22 as a notch in an arc shape.

The engaged portion 28 is formed in the printed circuit board 22 near a position where the connector 26 is provided. The engaged portion 28 is formed substantially as a quadrant. The engaged portion 28 is formed so that the curvature of an arc becomes larger from one side of the printed circuit board 22 toward a closed end of the engaged portion 28.

The fixing members 34 are each secured to the casing 18. Each of the fixing members 34 has a support portion 36 slidably supporting the engaging member 32 and an insertion hole 38 into which the engaging piece 30 is inserted. The insertion hole 38 is formed in the fixing member 34 as a notch in an arc shape of the same shape as the engaged portion 28.

The engaging member 32 has the cylindrical shaft portion 40, an extension 42 extending from the shaft portion 40 in a direction substantially perpendicular to the axis of the shaft portion 40, and the engaging piece 30 extending from the extension 42 in a direction substantially perpendicular to the axis of the extension 42. The extension 42 and the associated engaging piece 30 connected thereto are formed to extend substantially in an L-shape from the shaft portion 40 when the engaging member 32 is viewed from the lateral side with the shaft portion 40 located over the engaging pieces 30. As shown in FIGS. 4A and 4B, the engaging member 32 has a plurality of engaging pieces 30. The engaging member 32 has the engaging pieces 30 which are at least the same in number as the printed circuit boards 22. The engaging pieces 30 may be provided at regular intervals in the axial direction of the shaft portion 40 or may be provided at irregular intervals.

When the printed circuit boards 22 are to be locked by the lock mechanism 10, the engaging member 32 rotates about the axis of the shaft portion 40, whereby the engaging pieces 30 are respectively inserted into the engaged portions 28 of the printed circuit boards 22 as well as into the insertion holes 38 of the fixing members 34. As a result, each engaging piece 30 is engaged with the associated engaged portion 28, and each printed circuit board 22 is pressed toward the backplane 20 using the engaging piece 30 as the engaging piece 30 moves toward the closed end of the associated engaged portion 28. Further, each printed circuit board 22 is sandwiched between each extension 42 and the associated fixing member 34.

As shown in FIGS. 4A and 4B, an operating portion 46 formed as a dial is provided outside the casing 18. The operate is able to rotate the engaging member 32 about the axis of the shaft portion 40 by rotating the operating portion 46, and thus, it is possible to bring the engaged portions 28 of the printed circuit boards 22 and the associated engaging pieces 30 of the engaging member 32 into engagement or disengagement.

[Operation and Effect]

In the present second embodiment, the engaged portion 28 is formed in each printed circuit board 22 as a notch in the arc shape having a curvature getting greater from one side of the printed circuit board 22 toward the closed end of the engaged portion 28. Further, the engaging member 32 rotates about the axis of the shaft portion 40 for engagement and disengagement between each engaging piece 30 and the associated engaged portion 28. With this configuration, when the engaging member 32 rotates, it is possible to engage each engaging piece 30 with the associated engaged portion 28, and hence, to press each printed circuit board 22 toward a direction to fit the connector 26 of the printed circuit board 22 with the associated connector 24 of the backplane 20 using the engaging pieces 30.

Third Embodiment

In the first embodiment, when the operator operates the operating portion 46, the engaging pieces 30 of the engaging member 32 are brought into engagement with or out of engagement from the engaged portions 28 of the printed circuit boards 22. In a third embodiment, the engaging pieces 30 of the engaging member 32 are automatically brought into engagements with the engaged portions 28 of the printed circuit boards 22 when the casing 18 is attached to the back of the liquid crystal panel 14, and the engaging pieces 30 of the engaging member 32 are automatically brought out of engagements with the engaged portions 28 of the printed circuit boards 22 when the casing 18 is detached from the back of the liquid crystal panel 14.

Figure 6A:
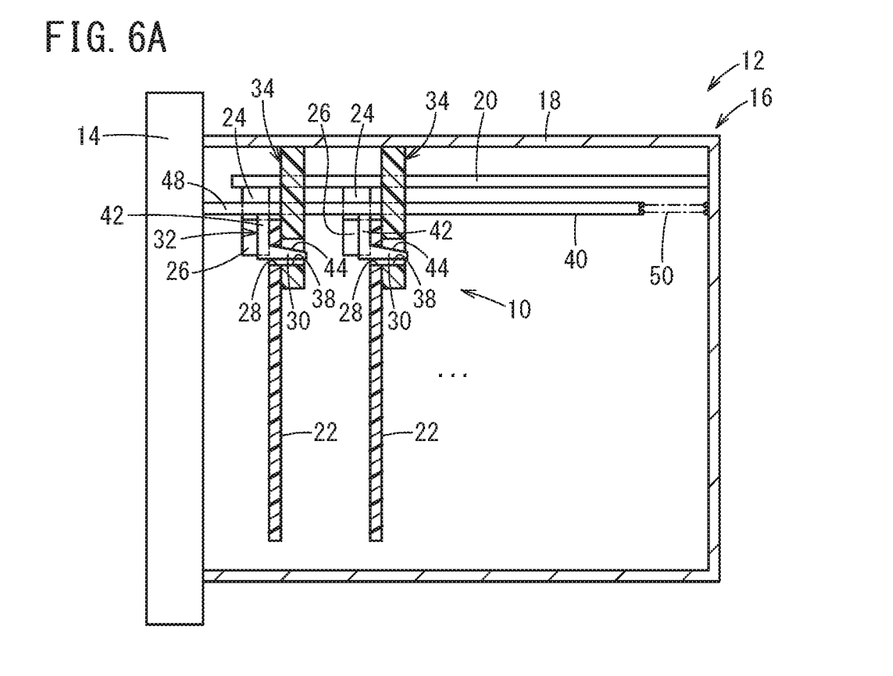
FIG. 6A is a schematic view showing a state inside a casing in which printed circuit boards are locked by a lock mechanism.
Figure 6B:
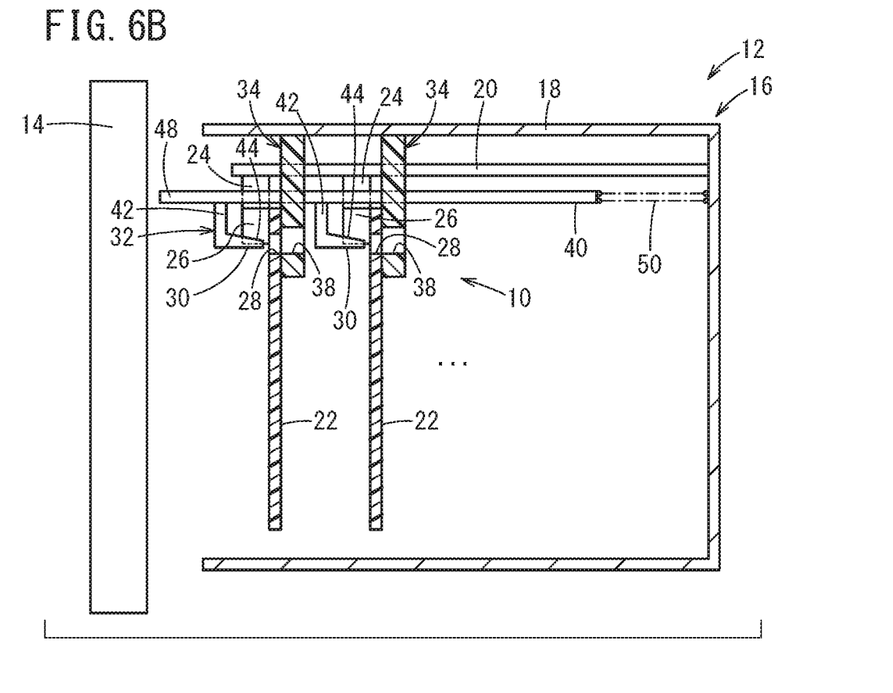
FIG. 6B is a schematic view showing another state inside the casing in which the printed circuit boards are released from being locked by the lock mechanism.

FIG. 6A is a schematic view showing a state inside the casing 18 in which the printed circuit boards 22 are locked by the lock mechanism 10. FIG. 6B is a schematic view showing another state inside the casing 18 in which the printed circuit boards 22 are released from being locked by the lock mechanism 10.

A protrusion 48 is formed on an end portion on the liquid crystal panel 14 side of the shaft portion 40 of the engaging member 32. A spring 50 is provided between the casing 18 and an end portion of the shaft portion 40 on a side opposite to the side on which the protrusion 48 is formed. In the state that the casing 18 is not attached to the liquid crystal panel 14, the engaging member 32 is moved by the urging force of the spring 50 in a direction to release the engagement between the engaging pieces 30 and the engaged portions 28 of the printed circuit boards 22. At this time, the protrusion 48 protrudes outside the casing 18. When the casing 18 is attached to the liquid crystal panel 14, an end portion of the protrusion 48 is pressed by the liquid crystal panel 14, whereby the engaging member 32 is moved in a direction to bring the engaging pieces 30 into engagements with the engaged portions 28 of the printed circuit boards 22.

[Operation and Effect]

In the present third embodiment, the spring 50 is provided to urge the protrusion 48 of the engaging member 32 in the direction to protrude outside the casing 18. When the casing 18 is attached to the liquid crystal panel 14, the liquid crystal panel 14 presses the protrusion 48 of the engaging ember 32, whereby the engaging member 32 is moved to bring the engaging pieces 30 of the engaging member 32 into engagements with the engaged portions 28 of the printed circuit boards 22.

With this configuration, when the casing 18 is attached to the back of the liquid crystal panel 14, the engaging pieces 30 of the engaging member 32 are automatically brought into engagements with the engaged portions 28 of the printed circuit boards 22, whereas when the casing 18 is detached from the back of the liquid crystal panel 14, the engaging pieces 30 of the engaging member 32 are automatically brought out of engagements with the engaged portions 28 of the printed circuit board 22.

[Technical Concept or Idea]

The technical ideas obtained from the foregoing embodiments will be described hereafter.

A lock mechanism (10) for locking inside a casing (18) a plurality of printed circuit boards (22) which are connected through connectors (24, 26) to a backplane (20) inside the casing (18), wherein the lock mechanism (10) has an engaging member (32) provided with a plurality of engaging pieces (30) respectively engageable with engaged portions (28) which are respectively formed in the plurality of printed circuit boards (22), and the engaging pieces (30) are configured such that the printed circuit boards (22) are pressed in a direction to fit the connectors (26) of the printed circuit boards (22) with the connectors (24) of the backplane (20) when the engaging pieces (30) are respectively engaged with the engaged portions (28). With this configuration, it is possible to firmly fit the connectors (26) of the printed circuit boards (22) with the connectors (24) of the backplane (20).

In the aforementioned lock mechanism (10), the engaged portions (28) may be formed near the connectors (26) of the printed circuit boards (22). With this configuration, it is possible to firmly fit the connectors (26) of the printed circuit boards (22) with the connectors (24) of the backplane (20).

In the aforementioned lock mechanism (10), the engaging member (32) may be disposed between the printed circuit boards (22) and the backplane (20). With this configuration, it is possible to avoid the casing (18) from being increased in dimension.

In the aforementioned lock mechanism (10), the engaging member (32) may have an operating portion (46), and the engaging member (32) may be configured to engage and disengage the engaging pieces (30) with the engaged portions (28) when the engaging member (32) is moved by the operation of the operating portion (46). With this configuration, it is possible for the operator to easily lock and release the lock mechanism (10).

In the aforementioned lock mechanism (10), an urging member (50) may be provided for pressing the engaging member (32) in a direction to allow a portion of the engaging member (32) to protrude outside the casing (18), wherein the engaging member (32) may be configured to be pressed by a device (14) when the casing (18) is attached to the device (14), so that the device (14) presses the protruded portion of the engaging member (32) outside the casing (18) to engage the engaging pieces (30) with the engaged portions (28). With this configuration, when the casing (18) is attached to the device (14), the engaging pieces (30) of the engaging member (32) are automatically engaged with the engaged portions (28) of the printed circuit boards (22), whereas when the casing (18) is detached from the device (14), the engaging pieces (30) of the engaging member (32) are automatically disengaged from the engaged portions (28) of the printed circuit boards (22).

In the aforementioned lock mechanism (10), the engaged portions (28) may each be formed as a hole extending through the printed circuit board (22) in a thickness direction, the engaging pieces (30) may be respectively configured to be engaged with or disengaged from the engaged portions (28) when the engaging member (32) is moved in the thickness direction of the printed circuit boards (22), and the engaging pieces (30) may each have a slant portion (44) at a surface in contact with the engaged portion (28). With this configuration, by moving the engaging member (32) in the thickness direction of the printed circuit boards (22), it is possible to engage the engaging pieces (30) with the engaged portions (28), and at the same time, by the slant portion (44), it is possible to press each printed circuit board (22) in a direction to fit the connector (26) of each printed circuit board (22) with the associated connector (24) of the backplane (20).

In the aforementioned lock mechanism (10), the engaged portions (28) may be respectively formed in the printed circuit boards (22) as a notch in an arc shape, and the engaging member (32) may be configured to rotate to engage and disengage the engaging pieces (30) with the engaged portions (28) respectively. With this configuration, by rotating the engaging member (32), it is possible to engage the engaging pieces (30) with the engaged portions (28). At the same time, by using the engaging pieces (30), it is possible to press the printed circuit boards (22) in a direction to fit the connectors (26) of the printed circuit boards (22) with the connectors (24) of the backplane (20).

Although certain preferred embodiments of the present invention have been shown and described in detail, it should be understood that various changes and modifications may be made therein without departing from the scope of the appended claims.

What is claimed is:

1. A lock mechanism for locking inside a casing a plurality of printed circuit boards which are connected through connectors to a backplane inside the casing, wherein
   the lock mechanism has an engaging member provided with a plurality of engaging pieces respectively engageable with engaged portions which are respectively formed in the plurality of printed circuit boards; and
   the engaging pieces are configured such that the printed circuit boards are pressed in a direction to fit the connectors of the printed circuit boards with the connectors of the backplane when the engaging pieces are respectively engaged with the engaged portions.

2. The lock mechanism according to claim 1, wherein each of the engaged portions is formed in a vicinity of the connector of each of the printed circuit boards.

3. The lock mechanism according to claim 2, wherein the engaging member is disposed between the printed circuit boards and the backplane.

4. The lock mechanism according to claim 1, wherein the engaging member has an operating portion; and
   the engaging member is configured to engage and disengage the engaging pieces with the engaged portions when the engaging member is moved by an operation of the operating portion.

5. The lock mechanism according to claim 1, further comprising:
   an urging member pushing the engaging member in a direction to allow a portion of the engaging member to protrude outside the casing;
   wherein the engaging member is configured to be pressed by a device when the casing is attached to the device so that the device presses the portion of the engaging member protruding outside the casing to engage the engaging pieces with the engaged portions.

6. The lock mechanism according to claim 1, wherein each of the engaged portions is formed as a hole extending through the printed circuit board in a thickness direction;
   the engaging pieces are respectively configured to be engaged with or disengaged from the engaged portions when the engaging member is moved in the thickness direction of the printed circuit boards; and each of the engaging pieces has a slant portion at a surface in contact with the engaged portion.

7. The lock mechanism according to claim 1, wherein each of the engaged portions is formed in each of the printed circuit boards as a notch in an arc shape; and the engaging member is configured to rotate to engage and disengage the engaging pieces with the engaged portions.

* * * * *